United States Patent [19]
Schmit et al.

[11] 3,949,223
[45] Apr. 6, 1976

[54] MONOLITHIC PHOTOCONDUCTIVE DETECTOR ARRAY

[75] Inventors: Joseph L. Schmit, Hopkins; Ernest L. Stelzer, Minnetonka, both of Minn.

[73] Assignee: Honeywell Inc., Minneapolis, Minn.

[22] Filed: Nov. 1, 1973

[21] Appl. No.: 411,970

[52] U.S. Cl. ............... 250/211 J; 250/578; 357/32
[51] Int. Cl.² .................................... H01L 27/14
[58] Field of Search ......... 250/211 J, 209, 208, 578; 357/29, 30, 48, 32

[56] References Cited
UNITED STATES PATENTS

| | | | |
|---|---|---|---|
| 2,805,347 | 9/1957 | Haines et al | 250/211 J |
| 2,863,056 | 12/1958 | Pankove | 350/211 X J |
| 3,028,500 | 4/1962 | Wallmark | 250/211 R |
| 3,462,605 | 8/1969 | Engeler | 250/211 J |
| 3,604,987 | 9/1971 | Assour | 250/209 |
| 3,617,823 | 11/1971 | Hofstein | 357/32 |
| 3,638,026 | 1/1972 | Scott et al | 357/32 X |
| 3,742,223 | 6/1973 | Carr et al | 250/211 J |

*Primary Examiner*—Walter Stolwein
*Attorney, Agent, or Firm*—David R. Fairbairn

[57] ABSTRACT

A photoconductive detector array is formed in a single body of semiconductor material. The individual photoconductive detectors are formed by regions of first conductivity type. The bulk of the semiconductor body is of a second conductivity type, thereby electrically isolating the individual photoconductive detectors from one another. This detector array is easier to fabricate than prior art detector arrays, and has unique signal enhancement properties.

13 Claims, 13 Drawing Figures

MONOLITHIC PHOTOCONDUCTIVE DETECTOR ARRAY

BACKGROUND OF THE INVENTION

The present invention relates to electromagnetic radiation detection systems. In particular, the present invention is directed to arrays of photoconductive detector elements.

When radiation of the proper energy falls upon a semiconductor, the conductivity of the semiconductor increases. Energy supplied to the semiconductor causes covalent bonds to be broken, and electron-hole pairs in excess of those generated thermally are created. These increased current carriers decrease the resistance of the material. This "photoconductive effect" in semiconductor materials is used in photoconductive detectors.

A photoconductive detector is a bar of semiconductor material having electrical contacts at the ends. In its simplest form, the photoconductive detector is connected in series with a direct-current voltage source and a load resistor. The change in resistivity of the photoconductive detector in response to incident radiation is sensed in one of two ways. If the resistance of the load resistor is much greater than the resistance of the detector, the device is operating in the "constant current mode," since the current through the detector is essentially constant. In this mode, the change in resistivity of the photoconductive detector is usually sensed by measuring the voltage across the photoconductive detector.

If, on the other hand, the resistance of the load resistor is much less than the resistance of the detector, the photoconductive detector is operating in the "constant voltage mode," since the voltage across the photoconductive detector is essentially constant. The change in resistivity of the photoconductive detector is usually sensed by measuring the voltage across the load resistor.

Of the two detector modes, the constant current mode finds wider use in photoconductive detectors made from semiconductor materials having low resistivity. For this reason, further discussion in this specification will deal with the constant current mode rather than the constant voltage mode.

Photoconductive detectors, and particularly arrays of photoconductive detectors, have found many applications. One particularly important area is in the detection of infrared radiation. Infrared sensitive photoconductive detector arrays are used for various heat and object sensing applications.

One widely used intrinsic infrared sensitive photodetector material is mercury cadmium telluride, which consists of a mixture of cadmium telluride and mercury telluride. Cadmium telluride is a wide gap semiconductor (Eg = 1.6 eV), and mercury telluride is a semimetal having a "negative energy gap" of about −0.3 eV. The energy gap of the alloy varies linearly with x, the mole fraction of cadmium telluride in the alloy, $Hg_{1-x}Cd_xTe$. By properly selecting x, it is possible to obtain mercury cadmium telluride detector material having a peak response at any of a wide range of infrared wavelengths.

Mercury cadmium telluride photoconductive detector arrays are presently fabricated by mounting a mercury cadmium telluride crystal on a substrate (e.g. Ge) with an epoxy. The thickness of the mercury cadmium telluride is then reduced to about 10 microns by lapping and etching. The detectors are then delineated and electrically isolated from one another by masking, cutting or etching. Electrical leads are then attached to opposite ends of each of the individual detector elements or to one end of each and a common.

This prior art technique for forming mercury cadmium telluride photoconductive detector arrays has several disadvantages. First, the entire process is quite complex and requires several steps. Second, the epoxy layer, in addition to complicating detector and detector array fabrication, results in a thermal barrier between the mercury cadmium telluride and the substrate. This thermal barrier can adversely affect performance in many device applications. Third, the reduction of thickness of the mercury cadmium telluride to about 10 microns requires considerable precision and is time consuming. Fourth, the isolation by cutting or etching is a time consuming step. Fifth, the electrical leads must be bonded directly to the mercury cadmium telluride detector material. The heat required for bonding can in some cases adversely affect the mercury cadmium telluride detector.

SUMMARY OF THE INVENTION

The present invention eliminates the foreign substrate, the thickness reduction process, and the isolation by cutting necessary in the prior art fabrication of photoconductive detector arrays. In the present invention, individual photoconductive detectors are an integral part of the substrate.

The photoconductive detector system of the present invention utilizes regions of a first conductivity type in a body of material having a second, opposite, conductivity type. Each of the regions of first conductivity type is used as a photoconductive detector by applying an electrical bias between two positions of the region and sensing the change in resistivity as a function of incident radiation. The individual photoconductive detectors are electrically isolated from one another by the PN junction which is formed between each region of first conductivity type and the body of second conductivity type.

DESCRIPTION OF THE PREFERRED EMBODIMENTS

Figure 1A:
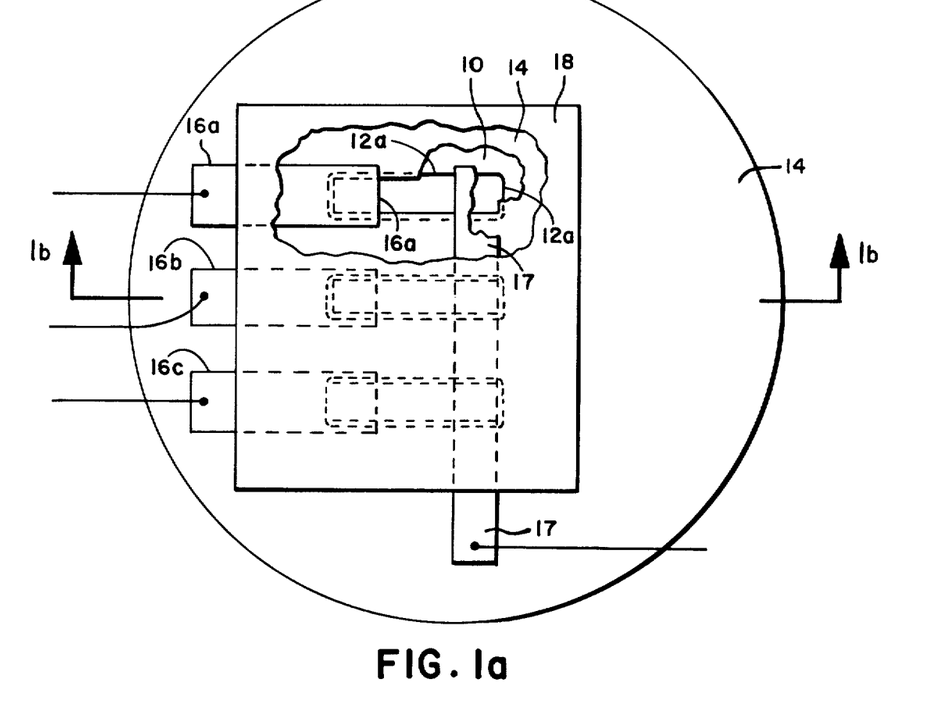
FIGS. 1a and 1b show a top and a cross sectional view, respectively, of a photoconductive detector array of the present invention.
Figure 1B:
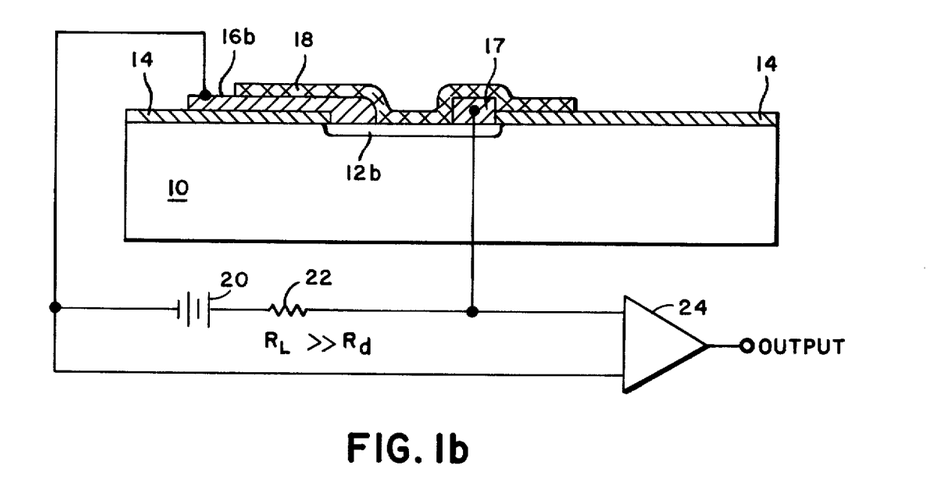

A three element, monolithic photoconductive detector array is shown in top and cross sectional views in FIGS. 1a and 1b. This detector array, while useful with most photoconductive materials, is particularly advantageous for detector arrays using mercury cadmium telluride. For that reason, the invention will be discussed using mercury cadmium telluride as an example. The number of detector elements, while specifically shown as three, is a matter of design choice. Three elements have been shown for illustrative purposes.

In the detector system of FIGS. 1a and 1b, regions 12 of first conductivity type are formed in a body of semiconductor material 10 having second conductivity type. The individual regions 12 are surrounded by the material of second conductivity type and therefore are electrically isolated from one another by PN junctions. Each of the regions 12 forms a PN junction with body 10.

The top surface of body 10 is covered with an insulator layer 14 which may, for example, be zinc sulfide. Electrical contact is made to one end of regions 12a, 12b, and 12c by metal contacts 16a, 16b, and 16c, respectively. Electrical contact to the opposite ends of regions 12a, 12b, and 12c is made by common metal contact 17. These metal contacts 16 and 17 are in the form of a thin metal layer which overlays insulator layer 14 and contacts one end of region 12. When region 12 is n-type mercury cadmium telluride, contacts 16 and 17 are preferably indium, which makes ohmic contact with n-type mercury cadmium telluride. When, on the other hand, region 12 is p-type mercury cadmium telluride, gold is a preferred contact material since it forms ohmic contact with p-type mercury cadmium telluride.

Thin layer 18 covers nearly all of the top surfaces of the detector array. This thin layer 18 serves two important functions. First, it forms a passivation layer for protection of the mercury cadmium telluride and the metal contacts. Layer 18 leaves only the end of metal contacts 16 and 17 exposed so that electrical lead wires can be connected to metal contacts 16 and 17. Second, layer 18 is an anti-reflection coating for the photoconductive detectors formed by the regions 12. Preferred materials for layer 18 are zinc sulfide and silicon oxynitride.

Each of the regions 12 is used as an individual photoconductive detector. An electrical bias is applied to each region 12 for a period which is greater than the carrier lifetime in the region. As a result, the intensity of radiation incident upon region 12 is integrated, and photoconductive gain is achieved.

As shown in FIG. 1b, the electrical bias may be applied to region 12 by connecting region 12 in series with battery 20 and load resistor 22. The electrical bias may also be applied by other means, such as a pulsing direct-current source, an alternating-current source, or a microwave generator, provided that the electrical bias is applied for a period which is greater than the carrier lifetime in region 12. The carrier lifetime is determined by the electrical properties of the semiconductor material forming region 12. For example, the carrier lifetime in nontrapping mode mercury cadmium telluride typically ranges from about $3 \times 10^{-7}$ second to about $8 \times 10^{-7}$ second, and the carrier lifetime in trapping-mode mercury cadmium telluride can be greater than $1 \times 10^{-3}$ second.

As shown in FIG. 1b, the photoconductive detector is operating in the constant current mode. The resistance $R_L$ of load resistor 22 is much greater than the resistance $R_d$ of the detector. As the resistivity of region 12 changes with incident radiation, the current through the circuit will remain essentially constant, but the voltage across region 12 will change in proportion to the change in resistivity. The voltage across region 12 is amplified by amplifier 24 to produce an output signal.

FABRICATION

Figure 2:
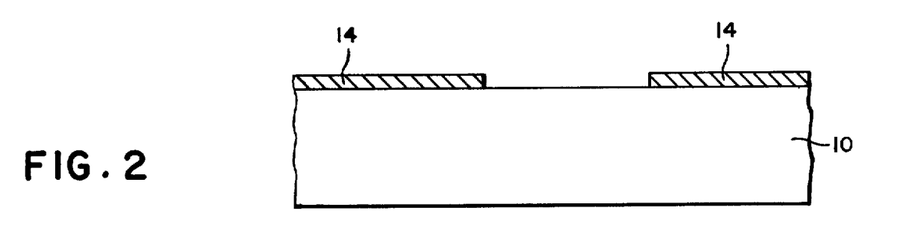
FIGS. 2 through 5 schematically show the fabrication of the detector array of FIGS. 1a and 1b.

FIGS. 2 through 5 show the fabrication process for the photoconductive detector array of FIGS. 1a and 1b. In FIG. 2 insulator layer 14 covers the first surface of body 10. An opening in insulator layer 14 has been formed by standard photomasking techniques to expose a portion of the first surface. Alternatively, a metal mask may be used to delineate regions 12. In that case, the metal mask would be removed after the formation of regions 12, and layer 14 would then be deposited on the surface.

Figure 3:
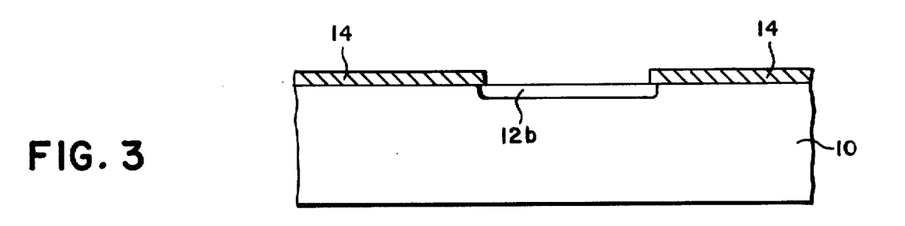

FIG. 3 shows the device after formation of region 12. Region 12 may be formed by a variety of techniques. One method involves adjusting the stoichiometric defect density of region 12. For example, if region 10 is p-type mercury cadmium telluride, an n-type region 12 can be formed by annealing body 10 in a metal rich (mercury, cadmium rich) atmosphere. Only the exposed portion of body 10 wll be converted from p-type to n-type. If, on the other hand, body 10 is initially n-type and region 12 is to be p-type, region 12 can be formed by annealing in a metal deficient (tellurium rich) environment. In each case, the stoichiometric defect density (and therefore conductivity type) of region 12 is dictated by the anneal temperature and the atmosphere. The length of time of the anneal will determine the thickness of region 12.

Another technique for forming region 12 is by impurity diffusion. For example, if body 10 is n-type mercury cadmium telluride, p-type regions 12 can be formed by the diffusion of gold into body 10. This process is described by M. W. Scott and A. E. Kloek in U.S. Pat. No. 3,743,553.

Still another technique for formation of regions 12 utilizes the bombardment of the exposed surface of body 10 with charged particles. Both protons and electrons have been shown to form n-type regions of mercury cadmium telluride in p-type mercury cadmium telluride. Proton bombardment was described by A. G. Foyt et al in *Applied Physics Letters*, 18, 321 (Apr. 15, 1971), and electron bombardment of mercury cadmium telluride was described by J. Melngailis et al in *Journal of Applied Physics*, 44, 2647 (1973). It is believed that bombardment of p-type mercury cadmium telluride with electrons or protons causes a damage induced donor state resulting in n-type conductivity.

A technique which is somewhat similar to particle bombardment is ion implantation. In this technique the type of ion will determine the conductivity type of region 12. For example, n-type regions of mercury cadmium telluride have been formed in a body of p-type mercury cadmium telluride by implantation of indium ions. This technique is the preferred technique for formation of region 12 since it results in a very sharp PN junction between region 12 and body 10. A sharp junction provides the best electrical isolation between the individual photoconductive detectors.

Figure 4:
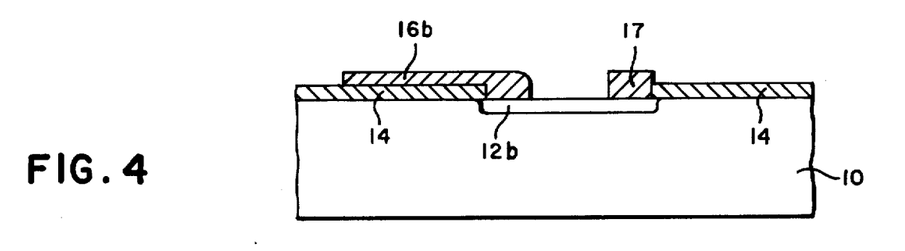

FIG. 4 shows the detector array after electrical contacts 16 and 17 have been deposited. Since the photoconductive detectors are an integral part of the substrate, the electrical contacts may be formed by evaporation of metal over the substrate and onto the photoconductive detector. This allows the lead wires to be attached at a position remote from the actual photoconductive detector. This reduces the likelihood of damage of the photoconductive detector by the heat required to bond the lead wires to the contacts.

Figure 5:
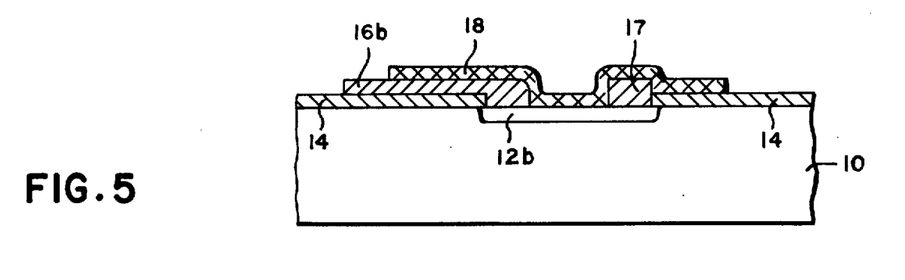

After metal contacts 16 and 17 have been deposited, layer 18 is deposited over the top surface of the detector array, as shown in FIG. 5. Layer 18 acts both as a passivating layer and as an anti-reflection layer. Layer 18 covers all but the outer edge of electrical contacts 16 and 17, so that lead wires can be attached to electrical contacts 16 and 17. Once the electrical leads have been attached, the detector array is ready to be connected in the system shown in FIG. 1b.

The process described in FIGS. 2 through 5 overcomes many of the disadvantages present in the prior art technique of photoconductive detector array fabrication. First, the present invention does not involve thickness reduction of the mercury cadmium telluride or the handling of extremely thin samples. The thickness of the photoconductive detectors formed by region 12 can be controlled when any of the techniques for forming region 12 are used. The photoconductive detector formed by region 12 is thin, yet it has the mechanical strength of the entire semiconductor body, since it is an integral part of the semiconductor body.

Second, the delineating process used to provide electrical isolation in prior art detector arrays is eliminated. Instead, the electrical isolation is provided by the PN junction between region 12 and body 10.

Third, the photoconductive detector formed by region 12 is an integral part of the substrate formed by body 10. The thermal barrier between the detector and the substrate in the prior art photoconductive detector arrays is therefore eliminated.

Fourth, the detector and the substrate are of the same material and thus have the same coefficient of thermal expansion. Electrical contacts 16 and 17, therefore, can be evaporated over the substrate to the photoconductive detector. In this way, the bonding of the electrical leads can be at a position remote from the photoconductive detector. As shown in FIG. 1, the electrical leads are attached to the detector contacts at the periphery of body 10.

MONOLITHIC DETECTOR ARRAY WITH BACKSIDE CONTACTS

Figure 6A:
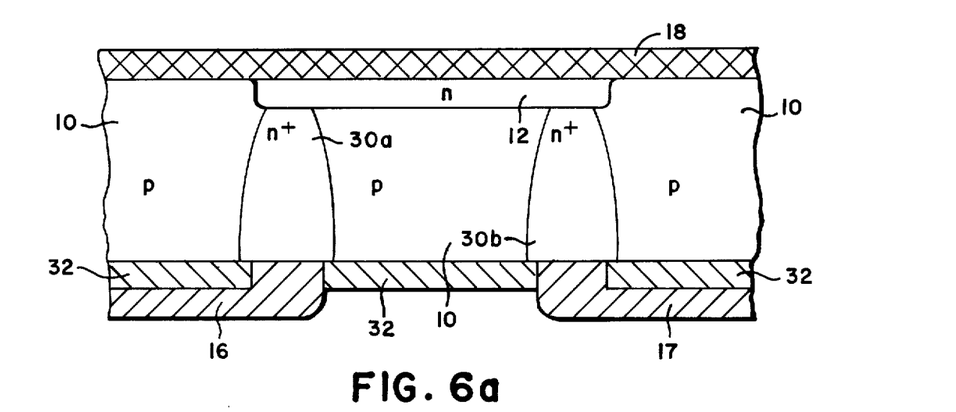
FIGS. 6a and 6b show cross sectional views of other embodiments of the present invention.
Figure 6B:
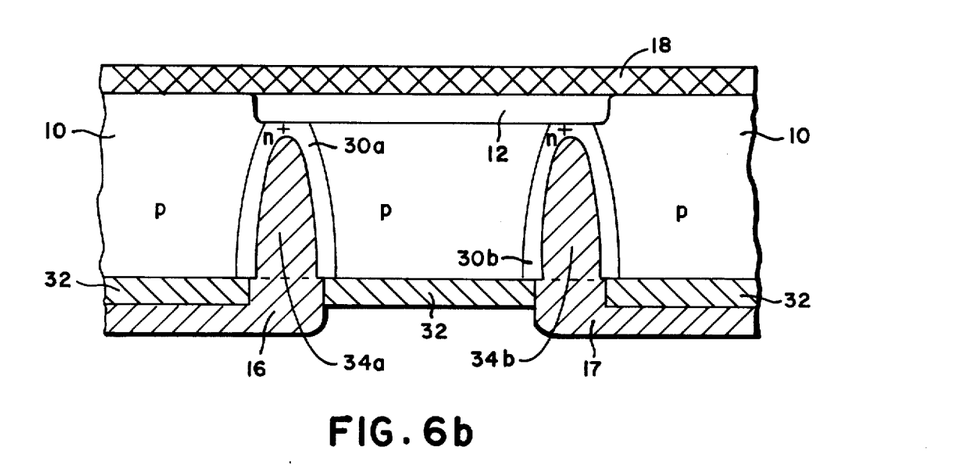

Still another fabrication advantage can be obtained using the present invention. In high density two-dimensional detector arrays, it becomes extremely difficult to make electrical contact to the individual detectors. The detector leads must not obscure other detectors of the array. For this reason, it would sometimes be advantageous to make electrical contact to the backside rather than the top side of the individual detector elements. FIGS. 6a and 6b show cross sectional views of two monolithic detector arrays in which electrical contact is made to the backside of the detector element. The detectors shown in FIGS. 6a and 6b are essentially similar to those described in the previous figures, and similar numerals are used to designate similar elements. For the purposes of illustration, detector region 12 is shown as having n-type conductivity, while the bulk of the substrate is shown as having p-type conductivity. It will be understood, however, that the conductivity types may be reversed.

In FIG. 6b, electrical contact is made to the two ends of detector region 12 by highly doped regions 30a and 30b. These highly doped regions 30a and 30b, which are designated as having n+ conductivity, extend from the back surface of substrate 10 to the backside of region 12. Highly doped regions 30a and 30b may be formed by diffusion, particle bombardment, or ion implantation. Electrical contacts 16 make contact with highly doped regions 30a and 30b at the back surface of substrate 10. Passivating and insulating layer 32 covers the back surface of substrate 10 except the portions at which contacts 16 and 17 are in contact with highly doped regions 30a and 30b. Since layer 32 provides electrical isolation, electrical contacts can be evaporated over layer 32 to the edge of the detector array where electrical leads are attached.

In some cases, the thickness of substrate 10 may be too great to form the highly doped regions 30a and 30b from the back surface all the way to detector region 12. FIG. 6b shows an alternative detector configuration which overcomes this difficulty. Cavities 34a and 34b extend from the back surface of substrate 10 toward region 12. In some cases, cavities 34a and 34b may extend all the way from the back surface through substrate 10 to the top surface. Cavities 34a and 34b may be formed by etching, particle bombardment, or ion milling. Highly doped regions 30a and 30b are then formed around cavities 34a and 34b and up to region 12. Electrical contacts 16 and 17 make electrical contact with highly doped regions 30a and 30b, respectively. As shown in FIG. 6b, the metal of electrical contacts 16 and 17 may be used to backfill cavities 34a and 34b.

SIGNAL ENHANCEMENT

Each of the foregoing advantages has dealt with the fabrication of the photoconductive detector array. There is, however, a very significant advantage in signal enhancement provided by the detector array of the present invention. The PN junction formed between the photoconductive detector and the substrate enhances the photoconductive signal by essentially isolating the photogenerated minority carriers in the photoconductive detector from the majority carriers. The minority carriers are swept across the junction while the majority carriers are allowed to flow in the photoconductive detector. This inhibits the recombination rate and extends the response time. The result is a signal enhancement which is somewhat analogous to that resulting from minority carrier trapping. This improvement can be quite significant in a material such as mercury cadmium telluride, which can have a very short carrier lifetime.

Figure 7:
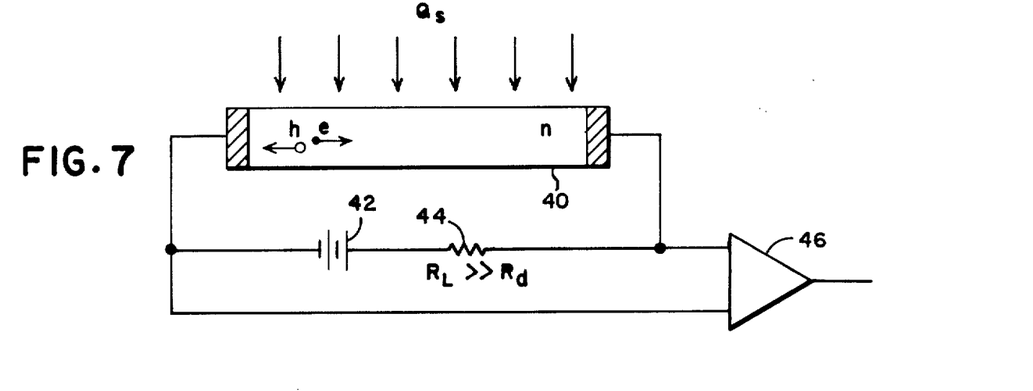
FIG. 7 shows a prior art photoconductive detector.

To understand the signal enhancement achieved by the present invention, one must first consider the signal processes in a simple prior art photoconductive detector. As shown in FIG. 7, the photoconductive detector is a body of n-type semiconductor material. Battery 42 and resistor 44 are connected in series with the detector. The change in resistivity with incident radiation is sensed by measuring the voltage across detector 40. Amplifier 46 amplifies this voltage to produce an output signal. The radiation $Q_s$ received by the photoconductive detector 40 creates an electron-hole pair. The hole is designated by $h$ and the electron by $e$.

Figure 8:
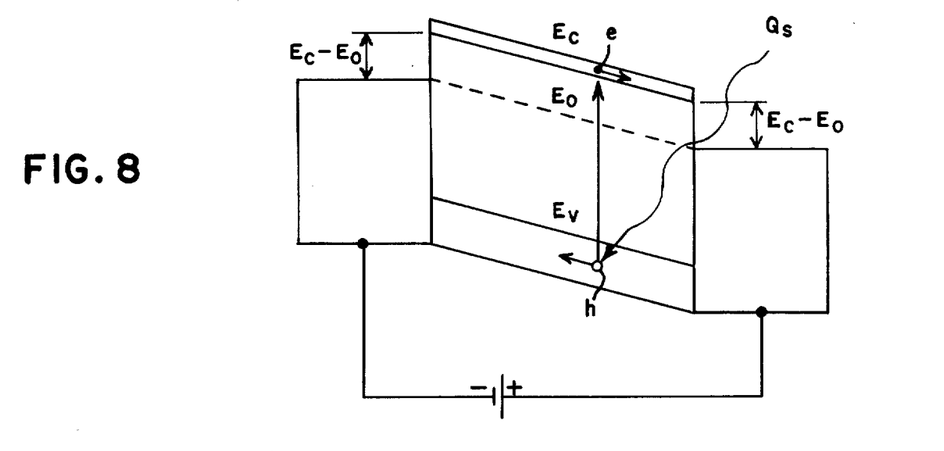
FIG. 8 is an energy level diagram of the photoconductive detector of FIG. 7.
Figure 9:
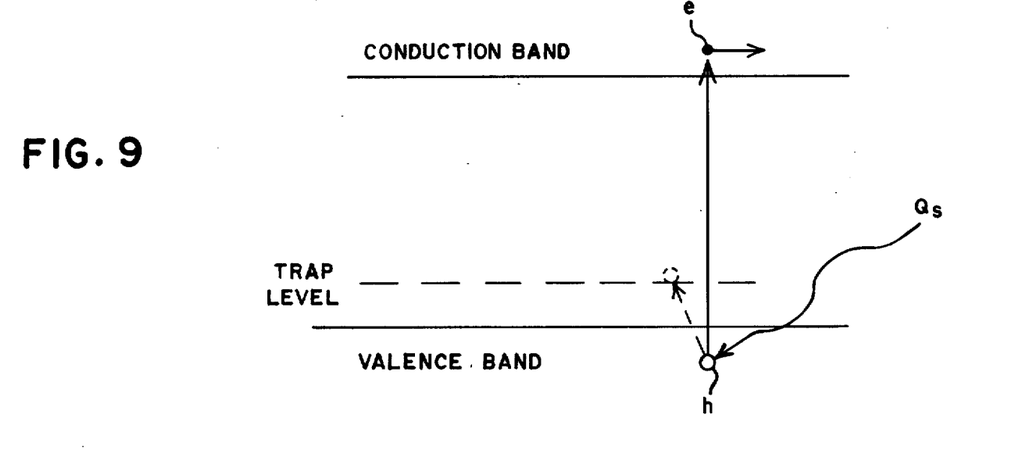
FIG. 9 is an energy level diagram of a photoconductive detector utilizing minority carrier trapping.

FIG. 8 shows a schematic energy level diagram of the detector of FIG. 7, an n-type semiconductor having ohmic contacts at both ends with a potential applied between the contacts. When a signal photon $Q_s$ is absorbed in the semiconductor material, an electron-hole pair is created. These excess carriers are not distinguishable from the thermal equilibrium carriers. The excess carriers drift with the applied field, resulting in charge separation, until recombination takes place. The magnitude of the photosignal depends primarily upon the number of electronhole pairs created per signal photon (quantum efficiency), the length of time these excess carriers are available for the conduction process, and the background carrier concentration.

In principle, therefore, the photosignal can be increased by simply extending the length of time that the excess carriers are available for the conduction process. This can be accomplished by introducing impurity or native defects that act as minority carrier traps in the semiconductor material. FIG. 8 schematically shows the conduction and valence band of a photoconductive material having minority carrier traps. Immediately after the electron-hole pair is created, an electron from the defect center traps the excess hole. In other words, the hole is raised to the defect level. Since the hole is now localized at the trap level, there is a low probability that the excess electron will recombine with the hole until the hole re-emitted from the trap to the valence band. The time required for the hole to be re-emitted increases the time that the excess electron is available in the conduction process, thus increasing the photosignal. Under the proper conditions, this increase in time and signal can be many orders of magnitude.

Figure 10:
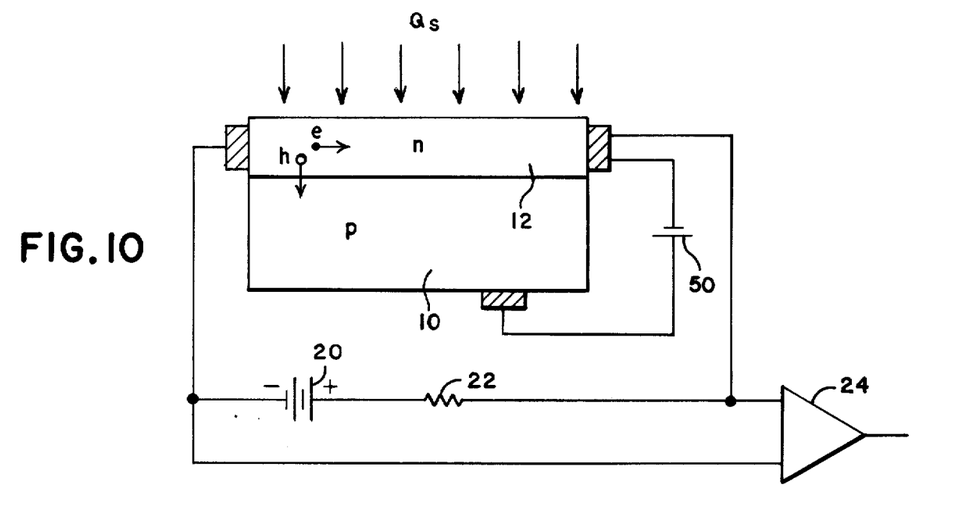
FIG. 10 is a schematic diagram of a photoconductive detector according to the present invention.

The present invention achieves a signal enhancement somewhat similar to minority carrier trapping in that the minority carrier is made unavailable for recombination. FIG. 10 shows a schematic diagram of the present invention in which region 12 has $n$-type conductivity and body 10 has $p$-type conductivity. Electrical contacts are made to opposite ends of region 12 and an electrical bias is applied. The change of resistivity of region 12 with incident radiation is sensed by measuring the voltage across region 12.

Figure 11:
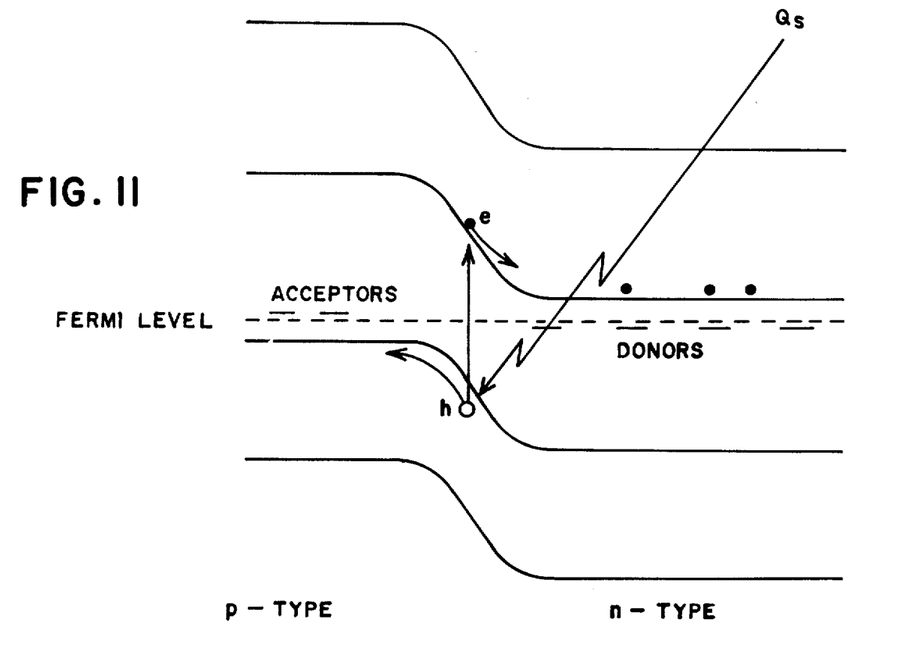
FIG. 11 is an energy level diagram of the PN junction in the detector of FIG. 10, showing the migration of minority carriers across the PN junction, thus enhancing the signal in the photoconductive detector.

As shown in FIG. 10, a signal photon $Q_s$ which is absorbed in region 12 will produce an electron-hole pair. The electron once again drifts toward the positive end of the photoconductive detector. The hole, however, does not drift toward the negative end as it did in FIG. 7. Instead, the hole is swept across the PN junction by the internal field of the PN junction. This process is shown schematically in FIG. 11, which is a schematic energy level diagram of the PN junction. Holes created within a diffusion length of the junction will drift to the junction and across the junction. The electrons, on the other hand, will flow in the $n$-type region and will thus contribute to the photoconductive current through n-type region 12. It is important to note that the photosignal is not measured across the junction, but rather across the $n$-type region 12. The PN junction serves only to effectively isolate the majority carriers (electrons) and the minority carriers (holes). By removing the minority carriers from the photoconductive region 12, the junction extends the majority carrier lifetime and thus enhances the photosignal in a manner which is somewhat analogous to minority carrier trapping.

As shown in FIG. 10, a reverse bias source 50 may be connected across the PN junction. This bias will tend to sweep more minority carriers across the junction. Alternatively, a forward bias may be used to reduce the number of minority carriers which are swept across the PN junction.

A major requirement for the signal enhancement of the present invention to be effective is that the diffusion length for minority carriers must be of the same order of magnitude as the thickness of region 12. If not, only a small fraction of the electron-hole pairs created will be affected by the PN junction. The minority carrier diffusion length L (in cm) is $$\left[ L = \frac{\mu kT}{q} \tau \right]^{1/2}$$

where
$\mu$ = carrier mobility, cm$^2$/Vsec
$T$ = temperature, °K
$\tau$ = minority carrier lifetime, sec
$q = 1.6 \times 10^{-19}$C
$k = 1.38 \times 10^{-23}$ J °K$^{-1}$.

For a mercury cadmium telluride photoconductive detector having $\mu = 10^3$cm$^2$/Vsec and $\tau \approx 10^{-7}$ sec when operating at a temperature of 100°K, the diffusion length L is on the order of 10 microns. This is the typical thickness of a mercury cadmium telluride photoconductive detector formed by region 12. The present invention therefore provides effective signal enhancement by the use of a PN junction in contact with a photoconductive detector.

CONCLUSION

The present invention is a photoconductive detector array system having several advantages over prior art photoconductive detector arrays. These advantages include simplified fabrication and enhancement of the photoconductive signal.

While this invention has been described with reference to several preferred embodiments, workers skilled in the art will recognize that changes in form and detail may be made without departing from the spirit and scope of the present invention. For example, although the present invention has particular advantage for mercury cadmium telluride photoconductive detector arrays, other semiconductor materials such as lead sulfide and indium antinomide may also be used. In addition, various techniques for sensing the resistivity change of a photoconductive detector such as using modulated radiation and an alternating-current amplifier are well known and may be used with this invention.

The embodiments of the invention in which an exclusive property or right is claimed are defined as follows:

1. An electromagnetic radiation detector system of the photoconductive detector type comprising:
   a body of semiconductor material having a plurality of spaced photoconductive regions of first conductivity type and having a second region of second conductivity type surrounding the plurality of spaced photoconductive regions and separating, at least at one end, each of the plurality from the others of the plurality, wherein the photoconductive regions have thicknesses of the same order of magnitude as the diffusion length of minority carriers in the photoconductive regions, and wherein the photoconductive regions and the second region define junctions which tend to cause separation of minority carriers from majority carriers in the photoconductive regions, thereby enhancing photosignals produced in the photoconductive regions;

electrical bias means for applying an electrical bias between two positions of one of the photoconductive regions for a period greater than the carrier lifetime in the photoconductive region; and sensing means for sensing the photosignal produced in one of the photoconductive regions in response to incident radiation.

2. An electromagnetic radiation detector system of the photoconductive detector type comprising:

a body of semiconductor material of second conductivity type, the body having a first surface and a second surface;

a plurality of photoconductive regions of first conductivity type formed in the semiconductor body, each of the photoconductive regions being exposed at the first surface and each of the photoconductive regions being electrically isolated at least at one end from other photoconductive regions by material of second conductivity type;

first electrode means connected to each of the photoconductive regions at one end of the photoconductive regions;

second electrode means connected to the opposite end of each of the photoconductive regions;

electrical bias means for applying an electrical bias between the first electrode means and the second electrode means for a period greater than the carrier lifetime in the photoconductive region; and sensing means connected to the first and second electrode means for sensing the change in resistivity of the photoconductive regions in response to incident radiation.

3. The system of claim 2 wherein an insulator layer substantially covers those portions of the first surface having the second conductivity type.

4. The system of claim 3 wherein the first and the second electrode means comprise metal strips deposited over the insulator layer and onto the first surface of the photoconductive region.

5. The system of claim 4 and further comprising an antireflection coating substantially covering the photoconductive region and the first and second electrode means.

6. The system of claim 2 wherein the first electrode means comprises:

a cavity extending through at least a portion of the body from the second surface toward a photoconductive region;

a highly doped region of first conductivity type surrounding the cavity and contacting the photoconductive region at one end of the photoconductive region; and contact means making electrical contact proximate to the second surface with the highly doped region of first conductivity type.

7. The system of claim 6 wherein the second electrode means comprises:

a cavity extending through at least a portion of the body from the second surface toward a photoconductive region;

a highly doped region of first conductivity type surrounding the cavity and contacting the photoconductive region at an opposite end of the photoconductive region; and contact means making electrical proximate to the second surface with the highly doped region of first conductivity type.

8. A photoconductive detector system comprising:

a body of semiconductor material having a photoconductive first region of first conductivity type and a second region of second conductivity type, wherein the photoconductive first region and the second region define a junction having a field associated therewith which tends to separate minority carriers from majority carriers in the photoconductive first region, thereby enhancing a photosignal produced in the photoconductive first region;

electrical bias means for applying an electrical bias between first and second positions on the photoconductive first region for a period greater than the carrier lifetime in the photoconductive first region;

means for sensing the photosignal produced in the photoconductive first region and wherein the photoconductive first region is exposed at a first surface and wherein the junction is substantially parallel to the first surface along substantially the entire length of between the first and second positions.

9. A mercury cadmium telluride photoconductive detector comprising:

a body of mercury cadmium telluride;

a thin layer of n-type conductivity in the body and exposed at a surface of the body;

a p-type region in the body;

a junction defined by the thin layer and the p-type region, the junction having a field associated therewith which enhances a photoconductive photosignal produced in the thin layer in response to incident radiation; and first and second electrode means connected to first and second positions, respectively, on the thin layer for deriving the photoconductive photosignal from the thin layer.

10. A mercury cadmium telluride photoconductive detector system as defined in claim 9 wherein the thin layer has a thickness of the same order of magnitude as the diffusion length of minority carriers in the thin layer.

11. A mercury cadmium telluride photoconductive detector system as defined in claim 9 wherein the junction is substantially parallel to the surface along substantially the entire length of between the first and second positions.

12. A photodetector comprising:

a photoconductive detector comprising:

a thin region of first conductivity type mercury cadmium telluride for producing a photoconductive photosignal in response to incident radiation; and first and second electrode means connected to first and second positions, respectively, on the thin region for deriving the photoconductive photosignal from the thin region;

means for enhancing the photoconductive photosignal, the means comprising:

a region of second conductivity type mercury cadmium telluride proximate the thin region; and a junction having a field associated therewith which tends to separate minority carriers from majority carriers in the thin region.

13. A photoconductive detector system comprising:

a body of semiconductor material having a photoconductive first region of first conductivity type and a second region of second conductivity type;

electrical bias means for applying an electrical bias between first and second positions on the photoconductive first region for a period greater than the carrier lifetime in the photoconductive first region;

electrode means connected to the first and second positions;

sensing means connected to the electrode means for sensing the change in resistivity of the photoconductive first region in response to incident radiation;

wherein the conductive first region has a thickness of the same order of magnitude as the diffusion length of minority carriers in the photoconductive first region and wherein the photoconductive first region and the second region define a junction, the junction having a field associated therewith which tends to separate minority carriers from majority carriers in the photoconductive first region; and wherein the photoconductive first region is exposed at a first surface and wherein the junction is substantially parallel to the first surface along substantially the entire length of between the first and second positions.

* * * * *